(12) United States Patent
Palsulich et al.

(10) Patent No.: US 8,765,000 B2
(45) Date of Patent: Jul. 1, 2014

(54) MICROFEATURE WORKPIECE PROCESSING SYSTEM FOR, E.G., SEMICONDUCTOR WAFER ANALYSIS

(75) Inventors: David A. Palsulich, Boise, ID (US); Ronald F. Baldner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 250 days.

(21) Appl. No.: 12/833,727

(22) Filed: Jul. 9, 2010

(65) Prior Publication Data

US 2010/0276394 A1    Nov. 4, 2010

Related U.S. Application Data

(63) Continuation of application No. 10/636,021, filed on Aug. 6, 2003, now Pat. No. 7,763,548.

(51) Int. Cl.
*H01L 21/302* (2006.01)
*B44C 1/22* (2006.01)
*H01L 21/322* (2006.01)

(52) U.S. Cl.
CPC ............... *H01L 21/302* (2013.01); *B44C 1/22* (2013.01); *H01L 21/322* (2013.01)
USPC ............................. 216/94; 438/745; 438/476

(58) Field of Classification Search
CPC ................................ H01L 21/032; B44C 1/22
USPC ............................................. 438/745; 216/94
See application file for complete search history.

(56) References Cited

U.S. PATENT DOCUMENTS

| | | | |
|---|---|---|---|
| 4,839,005 A | 6/1989 | Katsumoto et al. | |
| 5,196,353 A | 3/1993 | Sandhu et al. | |
| 5,621,847 A | 4/1997 | Tillotson et al. | |
| 5,658,183 A | 8/1997 | Sandhu et al. | |
| 5,762,537 A | 6/1998 | Sandhu et al. | |
| 5,762,755 A * | 6/1998 | McNeilly et al. | 438/708 |
| 5,807,165 A | 9/1998 | Uzoh et al. | |
| 5,842,909 A | 12/1998 | Sandhu et al. | |

(Continued)

FOREIGN PATENT DOCUMENTS

| | | | | |
|---|---|---|---|---|
| JP | 04141241 | * | 5/1992 | .............. B01L 11/00 |
| WO | 90/04045 A1 | | 4/1990 | |

(Continued)

OTHER PUBLICATIONS

Translated Abstract of JP 04141241, 1992 (2 pages).*

(Continued)

*Primary Examiner* — Nadine Norton
*Assistant Examiner* — Mahmoud Dahimene
(74) *Attorney, Agent, or Firm* — Perkins Coie LLP

(57) ABSTRACT

The present disclosure suggests apparatus and methods that can be used to chemically process microfeature workpieces, e.g., semiconductor wafers. One implementation of the invention provides a method in which a surface of a microfeature workpiece is contacted with an etchant liquid. The wall of the processing chamber may be highly transmissive of an operative wavelength range of radiation, but the etchant liquid is absorptive of the operative wavelength range. The etchant liquid is heated by delivering radiation through the wall of a processing chamber. This permits processing chambers to be formed of materials (e.g., fluoropolymers) that cannot be used in conventional systems that must conduct heat through the wall of the processing chamber.

19 Claims, 5 Drawing Sheets

(56) References Cited

U.S. PATENT DOCUMENTS

| | | | |
|---|---|---|---|
| 5,893,754 A | | 4/1999 | Robinson et al. |
| 5,957,750 A | | 9/1999 | Brunelli |
| 5,980,363 A | | 11/1999 | Meikle et al. |
| 5,981,396 A | | 11/1999 | Robinson et al. |
| 6,054,373 A | * | 4/2000 | Tomita et al. .......... 438/476 |
| 6,066,030 A | | 5/2000 | Uzoh |
| 6,117,781 A | | 9/2000 | Lukanc et al. |
| 6,143,155 A | | 11/2000 | Adams et al. |
| 6,176,992 B1 | | 1/2001 | Talieh |
| 6,187,681 B1 | | 2/2001 | Moore |
| 6,218,309 B1 | | 4/2001 | Miller et al. |
| 6,287,974 B1 | | 9/2001 | Miller |
| 6,312,558 B2 | | 11/2001 | Moore |
| 6,368,190 B1 | | 4/2002 | Easter et al. |
| 6,375,548 B1 | | 4/2002 | Andreas |
| 6,399,517 B2 | | 6/2002 | Yokomizo et al. |
| 6,451,714 B2 | | 9/2002 | Powell |
| 6,455,370 B1 | | 9/2002 | Lane |
| 6,869,500 B2 | | 3/2005 | Lee et al. |
| 7,763,548 B2 | | 7/2010 | Palsulich et al. |
| 2002/0160606 A1 | | 10/2002 | Siefering et al. |
| 2003/0057106 A1 | | 3/2003 | Shen et al. |

FOREIGN PATENT DOCUMENTS

| | | |
|---|---|---|
| WO | 00/05753 A1 | 2/2000 |
| WO | 02/23109 A1 | 3/2002 |
| WO | 03/021642 A2 | 3/2003 |

OTHER PUBLICATIONS

Marcus, R.A. et al., Infrared Absorption Spectra of Nitric Acid and its Solutions, Journal of Chemical Physics, vol. 27, No. 2, Aug. 1957, pp. 564-568.

Solvay S.A., "Electricity and Electronics—Semiconductors," 2 pages, Jan. 20, 2003, <http://www.solvaysolexis.com/Semiconductors.htm>.

Solvay Solexis, Inc., "Hyflon MFA and PFA Design Guide," 15 pages, Dec. 13, 2002, <http://www.solvaysolexis.com/pdf/HYFLON_GUIDE.pdf>.

Walker, P. et al., CRC Handbook of Metal Etchants, 1991, CRC Press LLC, pp. 914-915.

English-language translation of Japan Patent Application Publication No. 04-141421A, 6 pages.

* cited by examiner

MICROFEATURE WORKPIECE PROCESSING SYSTEM FOR, E.G., SEMICONDUCTOR WAFER ANALYSIS

CROSS-REFERENCE TO RELATED APPLICATION

This application is a continuation of U.S. application Ser. No. 10/636,021 filed Aug. 6, 2003, now U.S. Pat. No. 7,763,548, which is incorporated herein by reference in its entirety.

TECHNICAL FIELD

The present invention is related to equipment and methods for processing microfeature workpieces, e.g., semiconductor wafers. Aspects of the invention have particular utility in connection with removing films, e.g., metallic films, from surfaces of workpieces.

BACKGROUND

Surfaces of microfeature workpieces may be subjected to a variety of chemical processes during manufacture or in analytical processes, e.g., in quality control testing. As feature sizes on microfeature workpieces get smaller and performance depends more heavily on control of material compositions, microfeature workpieces become more sensitive to variations or contamination during such chemical processes.

For example, etching may be used in manufacturing operations to selectively remove specific portions of the surface of the workpiece, e.g., to form vias or other functional features, or to pattern a blanket conductive layer. There are generally two types of etching processes—"dry" etching and "wet" etching. Most dry etching operations are carried out using a high-energy plasma that may selectively remove the portions of the microfeature workpiece surface. Wet etching processes are generally conducted in a tank that contains a volume of a chemical etchant liquid.

FIG. 1 schematically illustrates a conventional dry etching system 10. The dry etching system 10 includes a vessel 12 that is designed to receive a microfeature workpiece W. A plasma is delivered to the interior of the vessel 12 by a plasma source 20 and is directed toward the microfeature workpiece W. In the embodiment schematically illustrated in FIG. 1, the plasma source 20 includes a gas supply 22 that communicates with a distributor 24 adjacent the top of the vessel 12. A microwave generator 26 or other energy source is placed in line between the gas supply 22 and the distributor 24 to generate a plasma that is directed toward the microfeature workpiece W by the distributor 24. Waste gas is withdrawn from the vessel 12 by an exhaust 16, which may include a vacuum pump.

In many circumstances, the plasma source 20 will provide sufficient energy to etch the surface of the microfeature workpiece W. In some circumstances, though, it may be advantageous to heat the microfeature workpiece W before, during, or after generating the plasma in the vessel 12. For this reason, dry etch systems may include one or more conduction heaters 14. Such conduction heaters 14 typically are placed outside the vessel 12 to separate them from the plasma and are most commonly positioned below the microfeature workpiece W. This requires that the heat generated by the conduction heater 14 be transferred to the microfeature workpiece W through the wall of the vessel 12. To keep process times acceptably short, the conduction heater 14 must heat this vessel wall significantly above the temperature of the microfeature workpiece W. The high energy plasma and the high temperatures employed by the conduction heaters 14 can significantly limit the materials suitable for forming the vessel 12.

FIG. 2 schematically illustrates a conventional wet etching system 50. In this wet etching system 50, a microfeature workpiece W is positioned in the interior of a tank 52 and immersed in an etching liquid 54. Carrying out wet etching at room temperatures may require the use of an overly aggressive etching liquid that makes it difficult to control the etching of the microfeature workpiece. For this reason, many wet etching systems heat the microfeature workpiece and/or the etching liquid during an etching process. The wet etching system 50 of FIG. 2 is schematically illustrated as having two types of heat sources. The first is an external conduction heater 60 that can conduct heat through the wall of the vessel 52 to heat the microfeature workpiece W, similar to the conduction heater 14 illustrated in FIG. 1. Either in addition to or instead of such an external conduction heater, the wet etching system 50 may include one or more internal heating elements 62. Such internal heating elements 62 can reduce thermal lag in the system and afford greater control over the etching process. Each of these heat sources has its disadvantages, though. As noted above, an external conduction heater 60 requires the wall of the tank 52 to be able to withstand elevated temperatures that exceed the maximum temperature of the etching liquid 54. This can significantly restrict the choice of materials for forming the tank 52. The internal heating elements 62 are in direct contact with the etching liquid. Any contamination from the heating elements 62 in the etching liquid 54 may contaminate the microfeature workpiece W. To limit this contamination, internal heating elements 62 are typically coated with a material that is substantially non-reactive with the etching liquid. Any coating defects that are initially present or that develop over time can still lead to contamination of the etching liquid 54, requiring frequent inspection and maintenance of the internal heating elements 62. In addition, the internal heating elements 62 typically require an electrical or other connection through a wall of the tank 52. Seals may be formed around these connections to limit any leakage or contamination of the etching liquid 54, but such seals are subject to degradation and present another maintenance requirement and potential point of failure.

As noted above, chemical processes may also be used in analyzing aspects of microfeature workpieces. For example, it may be desirable to etch or partially "digest" a microfeature workpiece W as a step in chemically analyzing a microfeature workpiece W. A so-called hot wafer digester, for example, may employ a system similar to the wet etching system 50 to dissolve a layer or film on a surface of the microfeature workpiece W. The resultant contaminated etchant liquid 54 may be analyzed using known analytical chemistry techniques to determine aspects of the composition of the film or other material removed from the microfeature workpiece W. If internal heating elements 62 are employed, though, the potential contamination from these heating elements 62 can reduce the reliability of such chemical analysis and may effectively preclude the detection of ultratrace concentrations of specific components in the material removed from the microfeature workpiece W. If an external conduction heater 60 is used instead of internal heating elements 62, the tank 52 typically must be formed of a high temperature material. One of the most common high temperature materials for hot wafer digesters is quartz. Commercial availability of quartz tanks sufficiently large to handle 300 mm-diameter wafers is quite limited, at least in part due to the difficulty and expense of manufacturing large vessels of high-purity quartz. In addition, hydrofluoric acid, a common semiconductor etchant, generally can not be used in a quartz vessel because it will attack the quartz.

DETAILED DESCRIPTION

A. Overview

Figure 1:
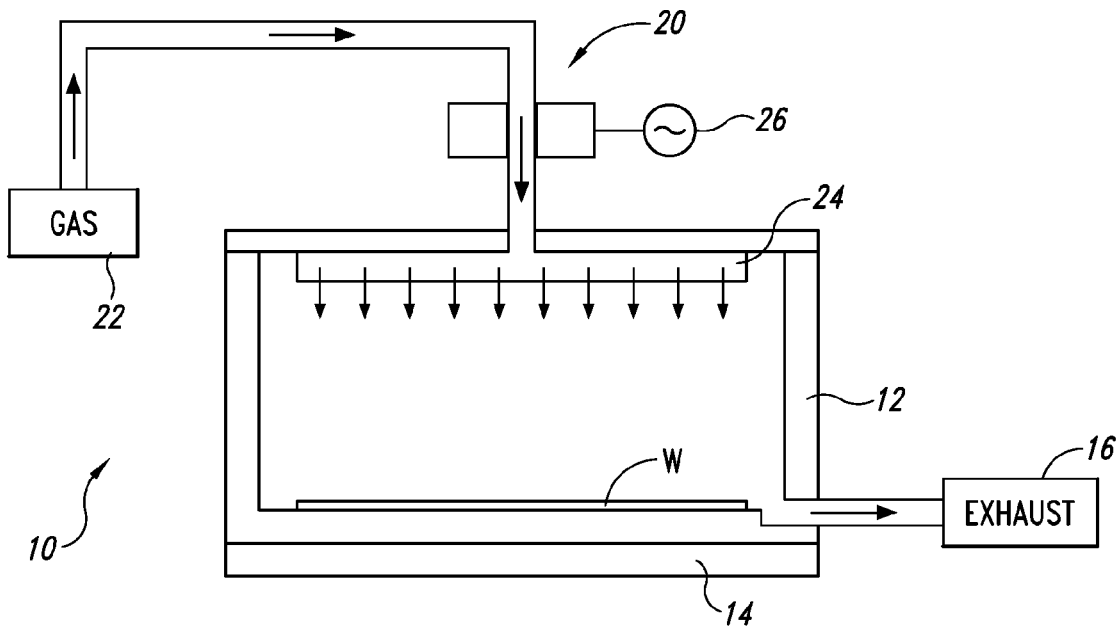
FIG. 1 is a schematic illustration of a conventional dry etching system 10.

Various embodiments of the present invention provide apparatus and methods for processing microfeature workpieces. Many specific details of the invention are described below with reference to chambers for etching materials, e.g., metal films, from microfeature workpieces. The term "microfeature workpiece" is used throughout to include substrates upon which and/or in which microelectronic devices, micromechanical devices, data storage elements, read/write components, and other devices are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Several embodiments in accordance with the invention are set forth in FIGS. 3-7 and the following text to provide a thorough understanding of particular embodiments of the invention. A person skilled in the art will understand, however, that the invention may have additional embodiments, or that the invention may be practiced without several of the details of the embodiments shown in FIGS. 3-7.

One embodiment of the invention provides a method of processing a microfeature workpiece. In accordance with this method, a microfeature workpiece is supported by a support, which may be unheated, in an interior of a processing chamber. A surface of the microfeature workpiece is contacted with an etchant liquid; a wall of the processing chamber is substantially non-reactive with the etchant liquid. The etchant liquid may be heated by delivering radiation from a radiation source through the wall of the processing chamber to heat the etchant liquid. The wall is highly transmissive of an operative wavelength range of the radiation and the etchant liquid is absorptive of the operative wavelength range. If so desired, the radiation source may be controlled to maintain a temperature of the etchant liquid at or above a target process temperature to etch the surface of the microfeature workpiece. The etched microfeature workpiece may be removed from the processing chamber.

A method of processing a microfeature workpiece in accordance with another embodiment of the invention involves positioning a microfeature workpiece on a support, which may be unheated, in an interior of a processing chamber, which may have an inner surface comprising a polymer. The microfeature workpiece may be enclosed within the interior of the processing chamber and a surface of the microfeature workpiece may be contacted with an etchant liquid at a first temperature. The etchant liquid may be substantially non-reactive with the inner surface of the processing chamber. This method continues by heating the etchant liquid from the first temperature to a second temperature using an infrared heat source positioned entirely outside the enclosed processing chamber. The second temperature is higher than the first temperature and the second temperature promotes etching of a surface of the microfeature workpiece. The surface of the microfeature workpiece may be etched with the etchant's liquid at or above the second temperature.

Another embodiment of the invention provides a method of processing a microfeature workpiece. In accordance with this embodiment, a microfeature workpiece supported in an interior of a processing chamber is contacted with a processing fluid. Infrared radiation is delivered through the wall of the processing chamber to heat the processing fluid from a first temperature to a higher second temperature that promotes processing of the microfeature workpiece surface. A temperature of the processing fluid may be maintained at or above the second temperature for a process time to process the surface of the microfeature workpiece. A temperature of the processing chamber wall may be no greater than the temperature of the processing fluid during the processing.

Still another embodiment of the invention provides a microfeature workpiece processing system that includes a processing chamber, a support, and a heating system. The processing chamber has a wall and an interior adapted to hold an etchant liquid. The wall comprises a polymer that is substantially non-reactive with the etchant liquid. The unheated support is adapted to support a microfeature workpiece in the processing chamber interior for processing. The heating system is positioned outside the processing chamber and adapted to selectively heat the etchant liquid. The heating system comprises a radiation source adapted to generate radiation in an operative wavelength range and oriented to direct the radiation through the wall of the processing chamber. The wall is substantially transparent to the operative wavelength range of the radiation and the etchant absorbs the operative wavelength range of the radiation.

A microfeature workpiece processing system in accordance with an alternative embodiment of the invention includes a processing chamber, a support, a conduit, an infrared radiation source and a programmable controller. The processing chamber has a wall and defines an interior in which a microfeature workpiece can be enclosed. The wall may comprise a fluoropolymer. The support is adapted to support the microfeature workpiece in the interior of the processing chamber and the conduit is adapted to deliver a processing liquid to the interior of the processing chamber for contact with a surface of the microfeature workpiece. The infrared radiation source is positioned outside the processing chamber and is oriented to direct infrared radiation through the wall of the processing chamber. The infrared radiation source may advantageously comprise substantially the sole heat source for heating the processing liquid. The programmable controller may be programmed to control the infrared radiation source to heat the process and liquid in the interior of the processing chamber from a first temperature to a higher second temperature to promote processing of the surface of the microfeature workpiece with the processing liquid.

For ease of understanding, the following discussion is subdivided into two areas of emphasis. The first section discusses microfeature workpiece processing systems in accordance with selected embodiments of the invention. The second section outlines methods in accordance with other aspects of the invention.

B. Microfeature Workpiece Processing Systems

Figure 3:
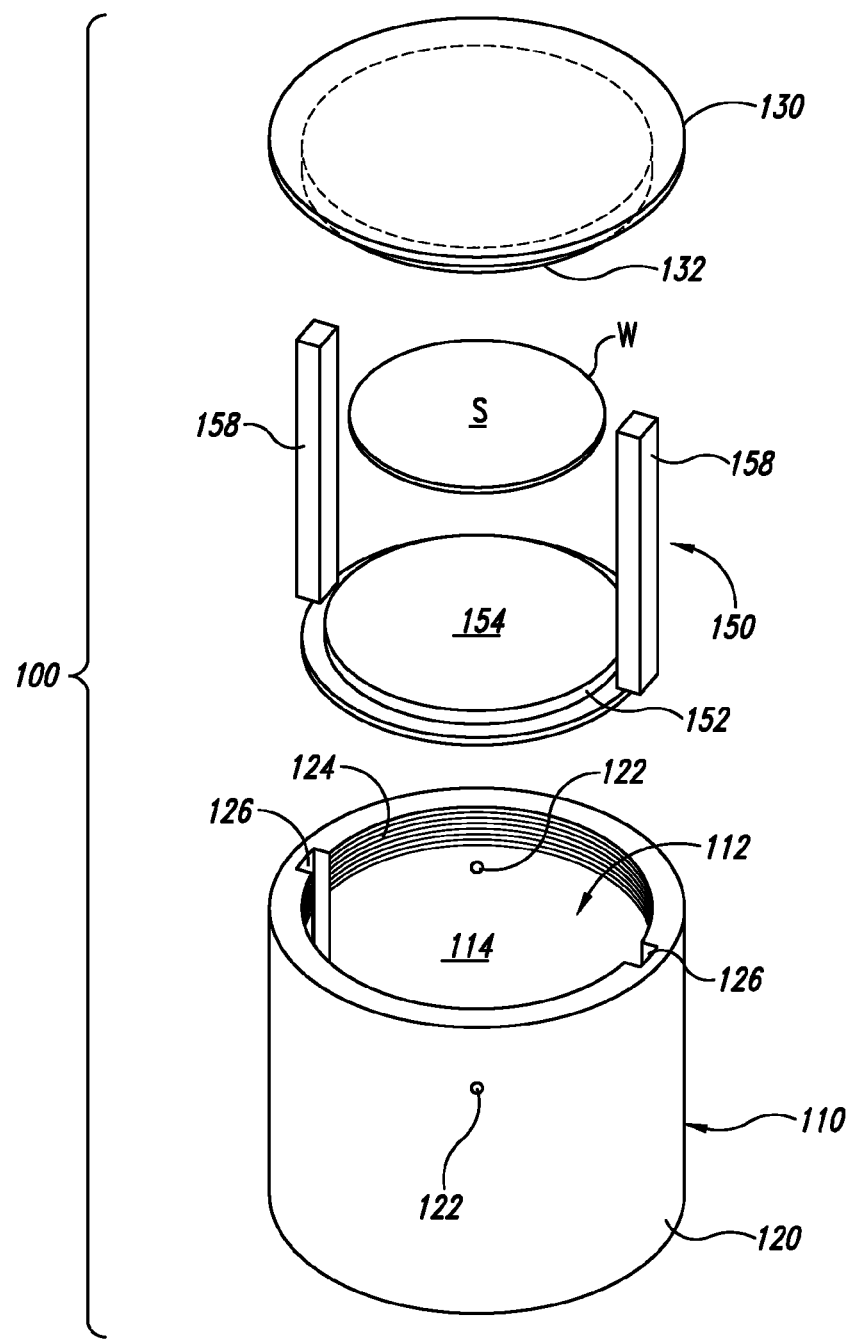
FIG. 3 is an exploded perspective view schematically illustrating elements of a microfeature workpiece processing system in accordance with one embodiment of the invention.
Figure 4:
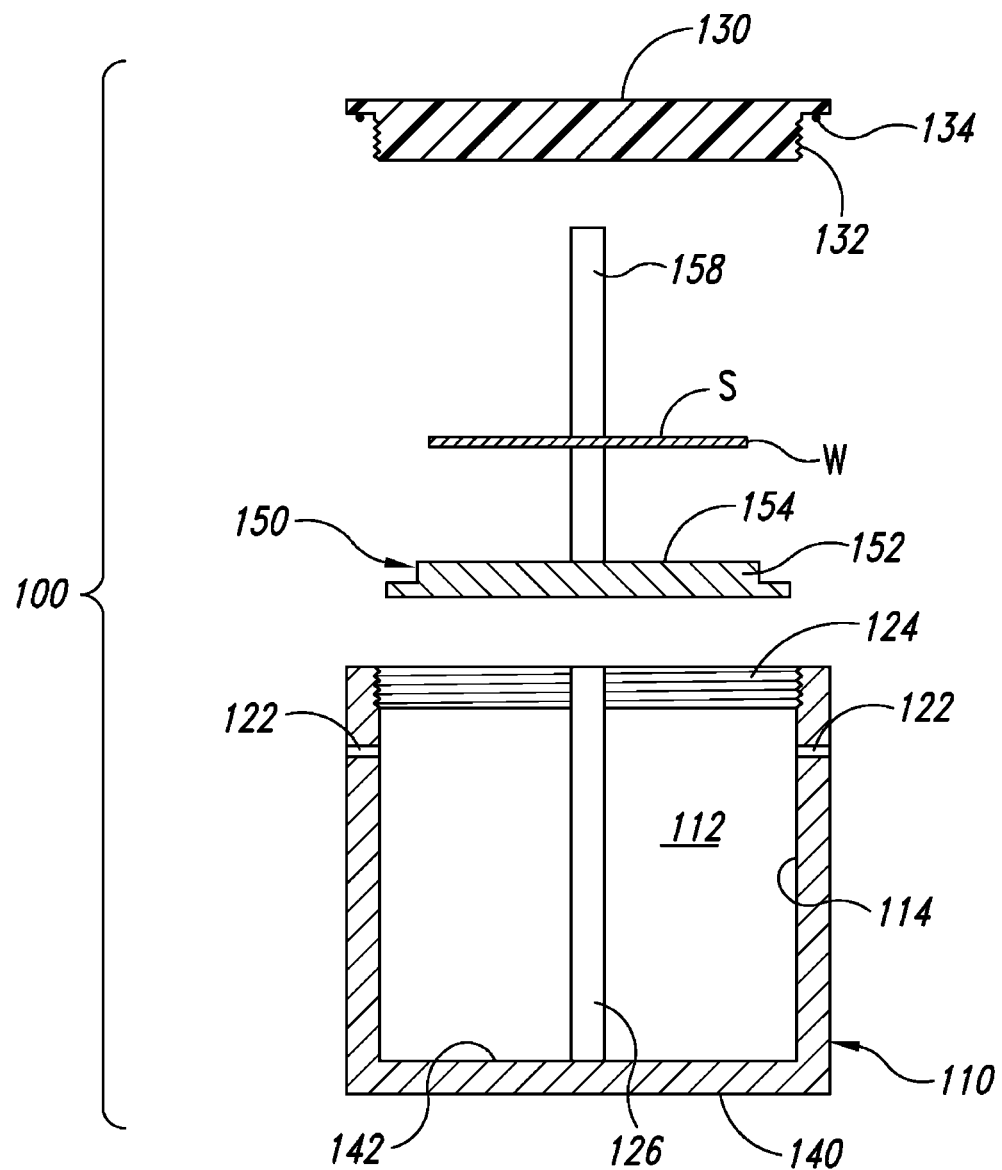
FIG. 4 is a schematic exploded, cross-sectional view of the elements of the microfeature workpiece processing system shown in FIG. 3.
Figure 5:
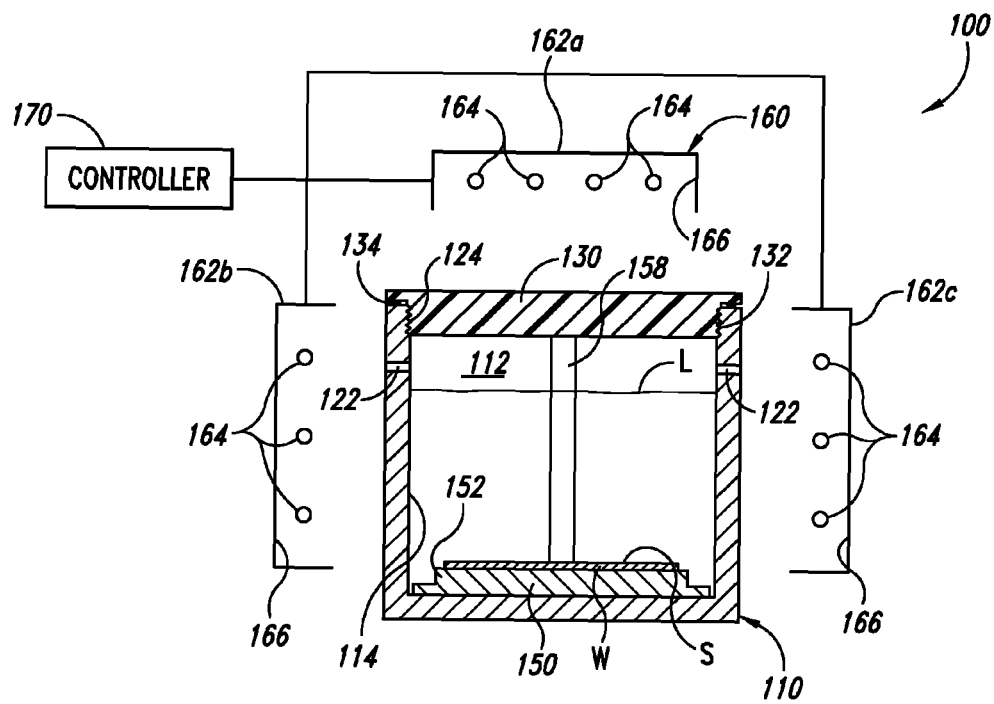
FIG. 5 is a schematic cross-sectional illustration of a microfeature workpiece processing system employing the elements illustrated in FIGS. 3 and 4.

FIGS. 3-5 schematically illustrate aspects of a microfeature workpiece processing system 100 in accordance with one embodiment of the invention. The microfeature workpiece processing system 100 generally includes a processing chamber 110, a support 150, and a heating system 160 (FIG. 5). The processing chamber 110 includes a plurality of walls that together define a processing chamber interior 112 adapted to receive a processing fluid, e.g., an etchant liquid, for use in processing a microfeature workpiece W. The inner surface 114 of the processing chamber 110 should be chemically compatible with the processing liquid to be received in the interior 112. In the particular embodiment shown in FIGS. 3-5, the walls of the processing chamber include a longitudinally extending wall 120, a cover 130, and a base 140. The longitudinally extending wall 120 may be generally cylindrical in shape and sealed at a lower end by the base 140. The inwardly-oriented face of the base 140 defines the bottom interior surface 142 of the processing chamber 110.

When the etchant liquid L in the processing chamber 110 is heated, the pressure within the processing chamber 110 will tend to increase. If so desired, the processing chamber 110 may be substantially sealed during processing and the pressure within the processing chamber 110 may simply be allowed to climb. If so desired, one or more vents 122 may be provided in the wall 120. These vents 122 may be in fluid communication with the headspace in the chamber interior 112 above the etchant liquid L to allow gas in the headspace to escape. If so desired, a one-way valve or other flow control mechanism may be included in each of the vents 122 to limit ingress of gas from the ambient environment during processing.

In some embodiments, the processing chamber 110 may be operated in an open, unenclosed configuration, e.g., with the processing chamber 110 upwardly open to allow the interior 112 to communicate with the environment outside the processing chamber 110. In the illustrated processing chamber 110, though, the cover 130 cooperates with the wall 120 to selectively define an enclosure for processing the microfeature workpiece W. The wall 120 and cover 130 may be movable from an open configuration to a processing configuration. In the open configuration, the cover 130 may be spaced from the wall 120 to allow a microfeature workpiece W to be introduced into or be removed from the interior 112. In the processing configuration, the cover may substantially sealingly engage the wall 120. In the illustrated embodiment, the cover 130 includes a threaded member 132 having threads adapted to mate with threads 124 carried by the wall 120. To further enhance the seal between the cover 130 and the wall 120, the cover 130 may carry a sealing member 134 (FIGS. 4 and 5), e.g., an O-ring, that can be compressed against the upper rim of the wall 120 when the threaded member 132 is threaded into the threads 124.

The microfeature workpiece processing system 100 also includes a support 150 adapted to support a microfeature workpiece W in the processing chamber interior 112 during processing. In one embodiment, the support 150 may simply comprise the bottom interior surface 142 of the processing chamber 110, i.e., the workpiece W may simply rest on the base 140. The particular support 150 shown in FIGS. 3-5 includes a pedestal 152 that includes an unheated support surface 154 for supportingly engaging the microfeature workpiece W. To facilitate introduction and removal of microfeature workpieces W, the support 150 may be movably received within the processing chamber interior 112. In one embodiment, the support 150 is adapted to be completely removed from the interior 112. If so desired, the support 150 may include one or more guides 158 adapted to cooperate with the wall 120 of the processing chamber 110 to guide movement of the support 150. The guides 158 are schematically depicted as rectangular rods adapted to be slidingly received in a respective keyway 126 formed in the wall 120 of the processing chamber 110. The guides 158 may have a dovetail configuration to provide a more positive engagement with a correspondingly shaped keyway 126. In another embodiment, the guides 158 include a keyway and the wall 120 may include one or more projections, e.g., dovetails, extending inwardly from the inner surface 114 to be received in the keyways of the guides 158.

If so desired, the guides 158 may be engaged manually or by automated equipment to lift or lower the support 150. In one embodiment, for example, a handle (not shown) may span the tops of the guides 158 and be received in the processing chamber interior 112. In another embodiment, the guides 158 may include an interface structure, e.g., a machine-graspable fitting, to facilitate movement with a robot or other automated equipment.

FIG. 5 schematically illustrates one embodiment of the heating system 160 for the processing system 100. This heating system 160 includes at least one heater 162, with three heaters 162a, 162b and 162c being illustrated in FIG. 5. Each heater 162 is adapted to generate radiation that may be directed into the interior 112 of the processing chamber 110 to heat a processing fluid, e.g., an etchant liquid L, therein. Each of the heaters 162 shown in FIG. 5 includes one or more lamps 164 or other radiation sources and a reflector 166, which may include a specularly reflective coating on the inner surface to direct radiation toward the processing chamber 110.

In many embodiments, a single heater 162 may be sufficient to selectively heat the etchant liquid L in the processing chamber interior 112. For example, a single heater 162a may be disposed above the processing chamber 110 and adapted to direct radiation downwardly toward the exposed surface S of the microfeature workpiece W. The heater 162a may be configured to deliver radiation substantially uniformly across the workpiece surface S. In the illustrated embodiment, the heating system 160 also includes two or more lateral heaters 162b-c arranged about the exterior of the processing chamber wall 120. Such lateral heaters 162b-c may more uniformly heat the etchant liquid L and irradiate the workpiece surface S, which may improve processing uniformity across the processing surface S of the workpiece W. The microfeature workpiece processing system 100 may further include a programmable controller 170 adapted to control the heating system 160. In one embodiment, the controller 170 comprises a computer having a programmable processor programmed to control operation of each of the heaters 162a-c to control the temperature of the etchant liquid L or other processing fluid in the processing chamber interior 112.

In some embodiments of the invention, the heating system may include elements other than radiant heaters 162. For example, internal heating elements similar to the heating elements 62 shown in FIG. 2 may be included. In the embodiment shown in FIG. 5, though, the radiation-based heaters 162 are substantially the only heat source for heating the etchant liquid L.

At least those portions of the processing chamber 110 and support 150 in contact with the etchant liquid L should be chemically compatible with the etchant liquid L. In one embodiment, the entire inner surface 114 of the processing chamber 110 is formed of or coated with a chemical that is substantially non-reactive with the etchant liquid. If the etchant liquid is hydrofluoric acid, for example, a wall 120 having an inner surface 114 comprising quartz may be inappropriate because quartz is not substantially non-reactive with hydrofluoric acid.

In many embodiments of the invention, at least one wall of the processing chamber 110 (e.g., the wall 120, cover 130, and/or base 140) is substantially transparent to an operative wavelength range of the radiation from the bulbs 164 or other radiation source of the heaters 162. As used herein, the term "substantially transparent" means that the wall is highly transmissive of the operative wavelength range of the heaters 162 and will not be unduly heated by direct absorption of radiation from the heaters 162 during processing of a workpiece W. The operative wavelength of the heaters 162 may be defined, at least in part, by the wavelength range(s) at which the etchant liquid L is sufficiently absorptive to efficiently heat the liquid. The operative wavelength range may vary from one etchant liquid to another. Generally, though, it is anticipated that an infrared wavelength, i.e., a wavelength of between about 700 nm and about 1 mm, will suffice for many etchant liquids L. In some applications, a near infrared wavelength, i.e., about 700-3,000 nm, is expected to work well. In many embodiments, the heaters 162 may emit radiation in relatively broad range of wavelengths, spanning both the operative wavelength range and wavelengths outside the operative wavelength range. For example, the heaters 162 may be adapted to emit radiation ranging from ultraviolet to microwave wavelengths, but the operative wavelength range for the etchant liquid falls primarily or entirely in the infrared spectrum.

In some embodiments of the invention, at least the cover 130 or the wall 120 of the processing chamber 110 is formed of a polymeric material. In one exemplary embodiment, the wall 120, base 140, and cover 130 of the processing chamber 110 are all formed of a polymeric material. In particular, it is anticipated that a processing chamber 110 formed of one or more fluoropolymers will work well. In particular, fluoropolymers selected from the group consisting of perfluoro-alkoxyalkane (PFA), polytetrafluoroethylene (PTFE), and fluorinated ethylene-propylene (FEP) are expected to be particularly well-suited because they are substantially non-reactive with many etchant liquids commonly used in processing semiconductor workpieces. For example, such fluoropolymers are generally substantially non-reactive with etchants as diverse as boiling aqua regia (three parts HCl/one part $HNO_3$), hydrofluoric acid, and hydrogen peroxide. Such fluoropolymers also have a couple of distinct advantages over quartz, which is more conventionally used in many semiconductor processing applications. First, quartz is significantly more likely to react with etchant liquids L, contaminating the etchant liquid L over time. Such contamination will often be deposited on the workpiece surface S, which can lead to defects in the microfeature workpieces W being processed. Second, reaction vessels 110 large enough to process the increasingly common 300 mm semiconductor workpieces can be made much more efficiently and cost effectively than a similarly sized quartz tank.

Figure 2:
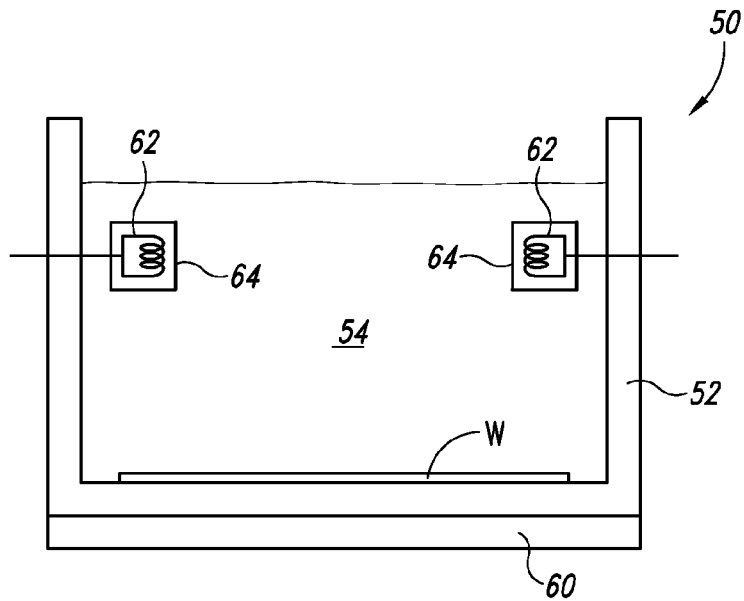
FIG. 2 is a schematic illustration of a conventional wet etching system 50.

Although a reaction chamber 110 formed of a polymeric material can afford some appreciable advantages over the more conventional quartz tanks 52 used in wet etching systems 50 (FIG. 2), most polymers have melting or softening points well below that of quartz. PFA, for example, has a melting point on the order of about 310° C. If the tank 52 of the wet etch system 50 of FIG. 2 is composed of a fluoropolymer, the temperatures necessary to heat the etchant liquid 54 in a commercially acceptable timeframe with the external conduction heater 60 likely would risk melting or deforming the tank 52. In contrast, the microfeature workpiece processing system 100 of FIG. 3-5 can efficiently heat the etchant liquid L without overheating the wall 120, base 140, or cover 130 of the processing chamber 110 because the components are substantially transparent to the radiation from the heaters.

In one embodiment, the wall 120, base 140, and cover 130 of the processing chamber 110 may all be formed of the same material, e.g., the same fluoropolymer. In another embodiment, though, the wall 120 and base 140 may be formed of one material and the cover 130 may be formed of a different material. For example, the wall 120 and base 140 may be integrally formed from a first fluoropolymer, e.g., PTFE or PFA, and the cover 130 may be formed of a different fluoropolymer, e.g., FEP. Such an arrangement may be advantageous if all of the radiant heat from the heating system 160 comes from one or more heaters 162 arranged above the processing chamber 110 to direct radiation downwardly through the cover 130.

The support 150 may be formed of any material that is suitably compatible with the etchant liquid L and the microfeature workpiece W. In one embodiment, the support 150 is formed of a polymeric material that is substantially transparent to the operative wavelength range of the heaters 160. This may not be necessary, though, if none of the heaters 162 are positioned to direct radiation through the base 140 of the processing chamber 110 and pedestal 152 of the support 150. Even if the pedestal 152 of the support 150 is formed of a material that is not substantially transparent to the operative wavelength range of the heaters 162, forming the guides 158 of the support 150 from such a material may enhance radiation uniformity if lateral heaters 162*b-c* are employed.

Figure 6A:
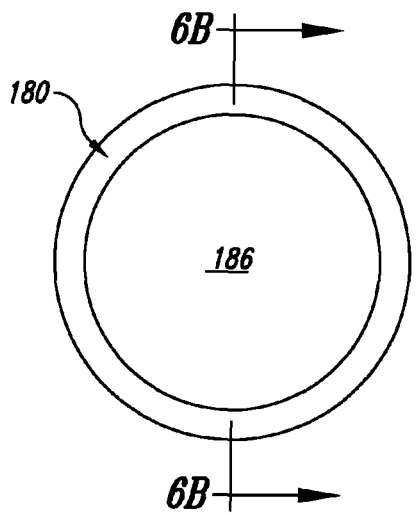
FIG. 6A is top elevation view of a cover for use in a microfeature workpiece processing system in accordance with a modified embodiment of the invention.
Figure 6B:
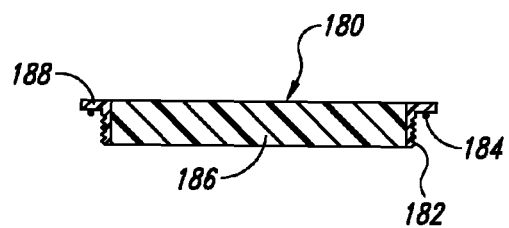
FIG. 6B is a schematic cross-sectional view of the cover of FIG. 6A taken along section line B-B in FIG. 6A.

FIGS. 6A and B illustrate a cover 180 in accordance with another embodiment of the invention. The cover 130 illustrated in FIG. 5 may comprise a single polymeric material. For example, the entire body of the cover 130 may comprise PFA, PTFE, or FEP. (The sealing member 34, if used, may be formed of a material that is softer or more pliant than the rest of the cover 130.) The cover 180 may be structurally similar to the cover 130, including a threaded member 182 adapted to be threadedly received by the threads 124 of the processing chamber wall 120. The cover 180 may also carry a sealing member 184, e.g., an O-ring, to sealingly engage the upper edge of the wall 120. Unlike the cover 130 though, the cover 180 includes a body 186 of one polymeric material and a ring 188 of another material, which may also be a polymeric material. In one embodiment, the body 186 comprises one fluoropolymer and the ring 188 comprises a different fluoropolymer. For example, the ring 188 may comprise PFA or PTFE and the body 186 may comprises FEP. This may enhance transmission of the operative wavelength of the upper heater 162*a* through the cover 180 while maintaining a suitably strong and easily manufactured mechanical link between the cover 180 and the processing chamber wall 120.

Figure 7:
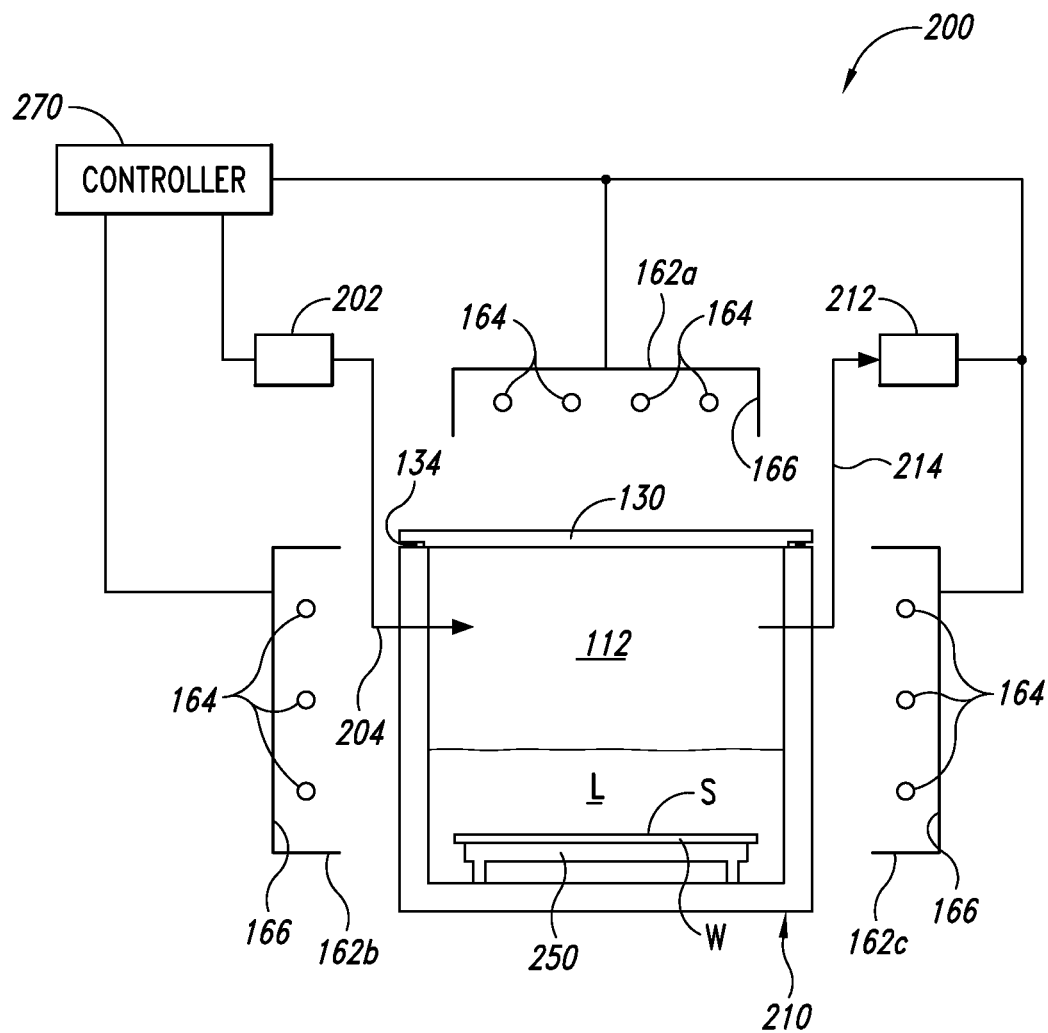
FIG. 7 is a schematic illustration of a microfeature workpiece processing system in accordance with another embodiment of the invention.

FIG. 7 schematically illustrates a microfeature workpiece processing system 200 in accordance with another embodiment of the invention. Many of the elements of this microfeature workpiece processing system 200 are similar to elements of the microfeature workpiece processing system 100 of FIGS. 3-5 and analogous elements generally bear the same reference number in FIGS. 3-7.

The support 150 of the processing system 100 shown in FIGS. 3-5 has a relatively flat support surface 154 (FIG. 4) carried by a support 150 that is entirely removable from the processing chamber 110. In contrast, the processing chamber 210 of FIG. 7 has a support 250 that may be permanently retained in the interior 112 of the processing vessel 210. If so desired, the support 250 may take the form of a susceptor ring that peripherally supports the back of the microfeature workpiece W, allowing the etchant to more freely contact the back surface of the microfeature workpiece W.

As noted above, the walls 120 of the processing chamber 110 shown in FIGS. 3-5 may include one or more vents 122, optionally including one-way valves, to vent excess pressure. The microfeature workpiece processing system 200 of FIG. 7 includes an inlet line 204 and an outlet line 214 instead of such vents 122. The inlet line 204 may be in fluid communication with a supply 202 and the outlet line 214 may be in communication with a pump 212. The supply 202 may be used to supply materials to the interior 112 of the processing chamber 210 during operation. For example, the supply 202 may comprise a supply of the etchant liquid L. This would allow additional quantities of the etchant liquid L to be added to the processing chamber 210 before or during the processing of a microfeature workpiece, for example. In other embodiments, the supply 202 may include a supply of a process gas to maintain an appropriate processing atmosphere above the etchant liquid L. The outlet line 214 and pump 212 may be used to vent any gaseous byproducts of the microfeature workpiece processing or allow a constant flow of process gas to be passed through the processing chamber interior 112.

The controller 270 of FIG. 7 may be similar to the controller 170 of FIG. 5. In addition to being connected to the heating system 160, the controller 270 may be operatively connected to the supply 202 and the pump 212 to control operation of those elements, as well.

C. Methods of Depositing Materials On Microfeature Workpieces

As noted above, other embodiments of the invention provide methods of processing microfeature workpieces. In the following discussion, reference is made to the particular microfeature workpiece processing system 100 shown in FIGS. 3-5. It should be understood, though, that reference to this particular processing system is solely for purposes of illustration and that the methods outlined below are not limited to any particular processing system shown in the drawings or discussed in detail above.

In accordance with one method of the invention, a microfeature workpiece W is supported on a support, e.g., an unheated support, in the interior 112 of the processing chamber 110. This support may comprise the base 140 of the processing chamber 110 or, as shown in FIG. 5, a separate support 150 may be positioned in the chamber interior 112. The surface S of the microfeature workpiece W may be contacted with the etchant liquid L (or other desired processing fluid) in the chamber interior 112. The etchant liquid L may be present in the chamber interior 112 before the workpiece W and the workpiece W and support 150 may be lowered into the bath of etchant liquid L. Alternatively, the etchant liquid L may be added to the chamber interior 112 after the support 150 and microfeature workpiece W are in position. If the etchant liquid L is to be added after the microfeature workpiece W is in place, the etchant liquid L may be delivered to the chamber interior 112 from an etchant supply 202 via an inlet line 204, as shown in FIG. 7.

Once the microfeature workpiece W is in place, it may be enclosed within the interior 112 of the processing chamber 110. In the embodiment illustrated in FIGS. 3-5, the microfeature workpiece W may be enclosed in the chamber interior 112 by screwing the cover 130 onto the wall 120. If a substantially air-tight seal is desired, the cover 130 may engage the upper edge of the wall 120 with sufficient force to create a seal with the sealing member 134.

The etchant liquid L may then be heated with the heating system 160. In particular, the etchant liquid L may be heated from a first temperature at which it initially contacts the microfeature workpiece W to an elevated temperature that promotes etching of the surface S of the microfeature workpiece W. The etchant liquid L may be at ambient temperature when it first contacts the microfeature workpiece W. If so desired, though, the etchant liquid L may be preheated (e.g., with the heating system 160) before contacting the microfeature workpiece W.

The controller 170 may control power delivered to the heaters 162 to heat the etchant liquid L in accordance with a predetermined time and temperature profile adapted to achieve the desired degree of etching of the workpiece surface S. If so desired, the temperature of the etchant liquid L may be monitored during processing of the microfeature workpiece W to ensure that the temperature falls within an acceptable range throughout the course of the processing. It should be possible to achieve consistent, reproducible results by simply following a fixed power profile, which may be empirically determined for the particular processing system 110, etchant liquid L, and microfeature workpiece W being processed.

The temperature of the etchant liquid L may be increased to a target process temperature that promotes etching and then be allowed to cool immediately. In another embodiment, the etchant liquid L is heated to the target process temperature and the temperature of the etchant liquid L is maintained at or above that target process temperature for a period of time sufficient to achieve the desired degree of etching of the surface S.

As noted above, the etchant liquid L is absorptive of an operative wavelength range of the heaters 162, but the wall or walls of the processing chamber 110 through which the radiation passes may be substantially transparent to the operative wavelength range. This will cause the etchant liquid L to heat more rapidly than the wall 120 of the processing chamber 110 such that the temperature of the wall 120 is no greater than the temperature of the etchant liquid L as the etchant temperature is increased. As a matter of fact, it is anticipated that the temperature of the wall 120 will be no greater than the temperature of the etchant liquid L except, perhaps, at the end of the processing cycle when the etchant liquid L is allowed to cool. This allows the processing chamber 110 to be formed from materials (e.g., fluoropolymers) that would not remain structurally stable if an external conduction heater 60 (FIG. 2) were used.

In accordance with a further embodiment of the invention, a portion of the etchant liquid L or other processing fluid may be removed from the chamber interior 112 for chemical analysis. As the workpiece surface S is etched, the reaction byproducts of the etchant liquid L and workpiece surface S will be added to the etchant liquid L, yielding a somewhat contaminated resultant etchant liquid L. The nature and relative proportions of the reaction products in the resultant etchant can be determined using conventional analytical chemistry techniques. The selection of appropriate analytical chemistry processes suitable for the nature of the microfeature workpiece W being etched is a simple matter for those skilled in this area and need not be discussed in detail here.

As noted above, microfeature workpiece processing systems in accordance with some embodiments of the invention may employ a reaction chamber (e.g., 110 or 210) that comprises a fluoropolymer, e.g., PFA, PTFE, or FEP. As is known in the semiconductor industry, such fluoropolymers can be used with a wide range of etchants with little or no contamination of the etchant. As a result, even materials that are present in the microfeature workpiece W at extremely low or "ultratrace" levels can be detected without concern that they originate from the material of the reaction chamber instead of the microfeature workpiece W itself. In contrast, the quartz commonly used to form the reaction chambers in hot wafer digesters may include trace impurities that leach into the etchant liquid L, reducing reliability of quantitative results for elements present only at very low concentrations.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

The invention claimed is:

1. A method of processing a microfeature workpiece, comprising:
supporting a microfeature workpiece in an interior of a processing chamber having a wall, the wall of the processing chamber being constructed substantially completely from a polymeric material;
contacting a surface of the microfeature workpiece in the processing chamber with an etchant liquid;
heating the etchant liquid by delivering radiation from a radiation source through the wall of the processing chamber to heat the etchant liquid, the wall being more transmissive of an operative wavelength range of the radiation than the etchant liquid; and
controlling the radiation source to maintain a temperature of the etchant liquid at or above a target process temperature to etch the surface of the microfeature workpiece.

2. The method of claim 1 further comprising adding the etchant liquid to the processing chamber at a first temperature that is below the target process temperature.

3. The method of claim 1 wherein heating the etchant liquid includes delivering radiation substantially uniformly across the surface of the microfeature workpiece.

4. The method of claim 1 wherein the radiation comprises infrared radiation.

5. The method of claim 1 further comprising enclosing the microfeature workpiece within the interior of the processing chamber.

6. The method of claim 1 wherein heating the etchant liquid includes heating the wall of the processing chamber to a wall temperature that is no greater than the temperature of the etchant liquid when the etchant liquid is at or above the target process temperature.

7. The method of claim 6 wherein the processing chamber includes a base constructed substantially completely from the polymeric material, and wherein heating the etchant liquid includes heating the base of the processing chamber to a temperature no greater than the temperature of the etchant liquid when the etchant liquid is at or above the target process temperature.

8. The method of claim 1 wherein the wall of the processing chamber is substantially completely constructed from a fluoropolymer, and wherein heating the etchant liquid includes delivering radiation from the radiation source through the fluoropolymer wall of the processing chamber, the fluoropolymer wall has a temperature that is no greater than the temperature of the etchant liquid when the etchant liquid is at or above the target process temperature.

9. The method of claim 1 wherein etching the surface of the microfeature workpiece yields a resultant etchant, the method further includes determining at least one chemical property of the microfeature workpiece by chemically analyzing the resultant etchant.

10. A method of processing a microfeature workpiece comprising:
positioning a semiconductor wafer in a processing chamber having a wall, the wall of the processing chamber being constructed substantially completely from a polymeric material;
contacting a surface of the microfeature workpiece in the processing chamber with an etchant liquid at a first temperature, the etchant liquid being substantially non-reactive with the wall of the processing chamber;
heating the etchant liquid from the first temperature to a second temperature using an infrared heat source positioned entirely outside the enclosed processing chamber, the second temperature being higher than the first temperature; and
etching the surface of the microfeature workpiece with the etchant liquid at or above the second temperature.

11. The method of claim 10 wherein heating the etchant liquid includes heating the wall of the processing chamber to a temperature no greater than a temperature of the etchant liquid.

12. The method of claim 10 wherein heating the etchant liquid includes heating the wall of the processing chamber to a temperature no greater than a temperature of the etchant liquid when the temperature of the etchant is rising from the first temperature toward the second temperature.

13. The method of claim 10 wherein heating the etchant liquid includes heating the wall of the processing chamber to a temperature no greater than a temperature of the etchant liquid when the temperature of the etchant liquid is at or above the first temperature.

14. The method of claim 10 wherein heating the etchant liquid includes heating the wall of the processing chamber to a temperature no greater than a temperature of the etchant liquid when the temperature of the etchant liquid is at or above the second temperature.

15. The method of claim 10 wherein positioning the semiconductor wafer includes positioning a semiconductor wafer with a dimension of about 300 mm in the processing chamber having the wall constructed substantially completely from the polymeric material, the polymeric material being selected from the group consisting of perfluoroalkoxylalkane (PFA), polytetrafluoroethylene (PTFE), and fluorinated ethylene-propylene (FEP).

16. A method of processing a microfeature workpiece, comprising:
supporting a microfeature workpiece in a processing chamber having a wall constructed from a polymer extending from an inner wall surface to an outer wall surface;
contacting a surface of the microfeature workpiece with a processing fluid;
delivering infrared radiation through the wall of the processing chamber to heat the processing fluid from a first temperature to a second temperature higher than the first temperature; and wherein the polymer for the wall is selected such that a temperature of the wall of the processing chamber is no greater than a temperature of the processing fluid when the temperature of the processing fluid is increasing from the first temperature toward the second temperature.

17. The method of claim 16 wherein:

the wall is substantially infrared transparent;

the processing fluid is absorptive of the infrared radiation; and the method further includes maintaining the temperature of the processing fluid at or above the second temperature for a process period to etch the surface of the microfeature workpiece.

18. The method of claim 16 wherein the polymer for the wall is selected such that the wall is less absorptive of the infrared radiation than the processing fluid.

19. The method of claim 16 wherein the polymer for the wall is selected such that the wall is substantially infrared transparent.

* * * * *